(12) United States Patent
Chang

(10) Patent No.: US 7,287,199 B2
(45) Date of Patent: Oct. 23, 2007

(54) DEVICE CAPABLE OF DETECTING BIOS STATUS FOR CLOCK SETTING AND METHOD THEREOF

(75) Inventor: Yen Sheng Chang, Tai Chung Hsien (TW)

(73) Assignee: Giga-Byte Technology Co., Ltd., Taipei Hsien (TW)

( * ) Notice: Subject to any disclaimer, the term of this patent is extended or adjusted under 35 U.S.C. 154(b) by 560 days.

(21) Appl. No.: 10/813,020

(22) Filed: Mar. 31, 2004

(65) Prior Publication Data

US 2005/0246586 A1 Nov. 3, 2005

(51) Int. Cl.
*G06F 11/00* (2006.01)
(52) U.S. Cl. .......................... 714/55; 714/51
(58) Field of Classification Search ............ 714/51, 714/55; 713/500
See application file for complete search history.

(56) References Cited

U.S. PATENT DOCUMENTS

| | | | | |
|---|---|---|---|---|
| 4,472,789 A | * | 9/1984 | Sibley | 713/502 |
| 6,535,988 B1 | * | 3/2003 | Poisner | 713/500 |
| 6,754,840 B2 | * | 6/2004 | Poisner | 713/500 |
| 7,058,854 B2 | * | 6/2006 | Piper et al. | 714/21 |
| 2003/0065966 A1 | * | 4/2003 | Poisner | 713/500 |

OTHER PUBLICATIONS

Kozierok, Chrales M., Overclocking CPU's—A Risky Route To Free Performance, Jun. 1998, Smart Computing, All Pages.*

* cited by examiner

*Primary Examiner*—Scott Baderman
*Assistant Examiner*—Tim Bonura
(74) *Attorney, Agent, or Firm*—Troxell Law Office, PLLC

(57) ABSTRACT

A method capable of detecting a status of a basic input/output system (BIOS) for setting a clock is applied to a clock generating device of a computer motherboard and sets the clock according to a signal status of the BIOS or a trigger signal. A device capable of detecting the BIOS status for setting the clock is also proposed. The device has a crystal oscillator, a frequency control unit, a phase-lock-loop (PLL) spread-spectrum unit electrically connected with the crystal oscillator and the frequency control unit, a memory unit having a clock setting value stored therein, a detection control unit electrically connected with the memory unit and used to detect a signal status, and a logic control unit electrically connected with the PLL spread-spectrum unit, the frequency control unit and the detection control unit.

6 Claims, 5 Drawing Sheets

DEVICE CAPABLE OF DETECTING BIOS STATUS FOR CLOCK SETTING AND METHOD THEREOF

FIELD OF THE INVENTION

The present invention is directed to a device capable of detecting a status of a basic input/output system (BIOS) for clock setting and a method thereof, and more particularly, to an auxiliary device, disposed inside a clock generating integrated circuit (IC), having a memory unit and a detection control unit, which employs a software detecting method to prevent the whole system from crashing due to undue over clock.

BACKGROUND OF THE INVENTION

The basic input/output system (BIOS) is a very important interface between the computer hardware and operating system (OS). The BIOS is in charge of initially setting and testing during booting the computer hardware to make sure that the hardware can work regularly. If the computer hardware works irregularly, the BIOS will inform the user of the fault. For example, it will show a fault message, e.g. the memory or hard disk malfunctions, on the screen. Further, if the display card isn't set completely, it may use a sound via the speaker to inform the user of the fault. For example, it may use a long or short sound to represent that the memory can be found. In practice, the length of the sound may have different meanings for different companies or different versions.

According to the setup menu of the BIOS, a user can press a key to execute a setting program before the operating system is booted. The user can use the setting program to set date, time, parameters of the hardware (e.g. memory), power saving condition, some setting values of computer peripherals, parameters of the hard disk or passwords.

Moreover, the BIOS also serves as the interface between the computer hardware and operating system. When the operating system needs to use the hardware, it will access the hardware via the BIOS. Since hardware of different companies differ, each company needs its own BIOS to communicate with the operating system.

The BIOS is a program stored inside the read-only memory (ROM). It includes many basic control codes of the computer output interfaces. After the computer is turned on, the BIOS will test the system and read the setting data stored in the complementary metal-oxide semiconductor (CMOS), such as the size of the hard disk, if the optical drive is available, system time, if the shadow random access memory (RAM) is in use, etc.

A mechanism is necessary between components, inside the central processing unit (CPU), or between two units of equipment to coordinate the simultaneous operations of two ends for normal processing of the digital signals. Nonetheless, the time spacing for accessing data is decided by the clock of the system. All digital products have an electronic component, called a "clock generator". This component will continuously generate voltage pulses with constant time spacing. All of the components inside the product will operate with this clock synchronously. In other words, the digital products need the clock for precise processing of the digital signals, in a manner analogous to the heartbeat of animals. If the clock is unstable, it will cause the transmission error of the digital signals or make the digital equipment malfunction.

Every component on the motherboard has its specific operation frequency and the proportion of the operation frequency of each bus to that of the system is fixed, mostly. In other words, the conventional clock generator usually uses the external frequency of the CPU as a reference frequency and divides the frequency according to the fixed proportion to generate the clocks used for other peripherals.

"Over clock" means making a CPU work with a clock frequency not described in the specification or not supported by the CPU, such as making a Pentium 120 work as a Pentium 133. However, since motherboards now have a new external frequency, a user can change the internal or external frequencies to an abnormal value. This new type of over clock can make the performance of the system much superior to that of past. Even the fastest CPU can perform better this way.

Reference is made to FIG. 1, which is a block diagram of a conventional device capable of detecting a BIOS status for clock setting. It includes a BIOS 10, a clock generating integrated circuit (IC) 12, a CPU 14, a peripheral component interconnect (PCI) port 16, an accelerated graphic port (AGP) 18 and a double data rate (DDR) memory 20.

Its operation method employs the BIOS 10 to send the frequency setting value set by the user to the clock generating IC 12 to make it generate the frequencies necessary for the peripheral components.

Reference is made to FIG. 2, which is a block diagram of a conventional clock generating IC. It includes the BIOS 10, the clock generating IC 12, a logic control circuit 120, a phase-lock-loop (PLL) spread-spectrum unit 122, a crystal oscillator 124, a microprocessor frequency control unit 126, a PCI frequency control unit 128, an AGP frequency control unit 130 and a DDR memory frequency control unit 132.

Its operation method employs the BIOS 10 to send the frequency setting value set by the user to the logic control circuit 120 of the clock generating IC 12. The crystal oscillator 124 of the clock generating IC 12 will generate a clock signal with a constant period and send it to the PLL spread-spectrum unit 122. Subsequently, the PLL spread-spectrum unit 122 will send the clock signal to the logic control circuit 120, microprocessor frequency control unit 126, PCI frequency control unit 128, AGP frequency control unit 130 and DDR memory frequency control unit 132, respectively. Then, the logic control circuit 120 will generate the frequencies necessary for the peripheral components.

At present, users usually raise the operation frequency of the CPU to obtain the best performance. Sometimes, they may raise the frequency of the CPU excessively. This causes a system to be unstable, to crash or to malfunction. In these situations, the watchdog mechanism may also be unable to work. In the worse case, the user needs to delete the data stored by CMOS components. However, this reinitializes the system and causes the user further inconvenient.

Further, after the operating system switches to the sleep mode, the host computer still needs to keep providing some electricity to the clock generator so as to make it able to output the last operation frequency normally when the system is woken up.

If the host computer doesn't keep providing some electricity to the clock generator, the BIOS will reset the operation frequency when the system is woken up. Such a way will require the capacity of the EEPROM used to store the BIOS to be larger. At the same time, it will cause the software engineer more trouble.

Accordingly, as discussed above, the prior art still has some drawbacks that could be improved. The present invention aims to resolve the drawbacks in the prior art.

SUMMARY OF THE INVENTION

An objective of the present invention is to provide a device capable of detecting a status of a basic input/output system (BIOS) for clock setting and a method thereof. The present invention adds a memory unit to the clock generating device for storing a correct clock setting value of the clock generating device. The present invention also provides a detecting method to prevent the whole system from crashing due to over clock.

The main technical feature of the present invention is to add a memory unit to the clock generating device for storing a correct clock setting value of the clock generating device. The present invention also provides a detecting method to prevent the whole system from crashing due to over clock. When the over clock process fails, the clock generating device will use the correct clock setting value stored in the memory unit automatically and then re-boot the computer. Further, after entering the sleep mode, the clock generating device doesn't need any electric power. Hence, it has the advantage of power saving. When the system is woken up later, the clock generating device will also use the correct clock setting value automatically and the BIOS doesn't need to perform any process. Hence, the booting time can be reduced.

The present invention can also save the developing time since the output frequency of the clock generating device can be set haphazardly and a user can change the output frequency according to his need. Moreover, the output frequency of the clock generating device can correspond to any output port. Hence, the present invention can diversify the generating device and shorten the designing time and verifying time.

Furthermore, the memory unit of the present invention can be rewritable or inerasable memory. The rewritable memory can record multiple setting values and the clock generating device can be designed to choose the best setting value automatically or be set with multiple setting value arbitrarily. The inerasable memory can record a best setting value for reaching the best performance and it can be used to prevent the system from being counterfeited.

As described above, the present invention has the following advantages:

(1) In any situation of the system, the present invention can suitably program the clock generating device according to the requirements of the system.
(2) The present invention can reduce booting time.
(3) The number of BIOS codes can be reduced.
(4) The size of the memory unit for storing BIOS codes can be reduced.
(5) The burden of the software engineers can be reduced.
(6) The motherboard can be simplified.
(7) The verifying time can be shortened relatively.
(8) The present invention can protect the motherboard from being counterfeited.

Numerous additional features, benefits and details of the present invention are described in the detailed description, which follows.

BRIEF DESCRIPTION OF THE DRAWINGS

The foregoing aspects and many of the attendant advantages of this invention will be more readily appreciated as the same becomes better understood by reference to the following detailed description, when taken in conjunction with the accompanying drawings, wherein.

DETAILED DESCRIPTION

Figure 1:
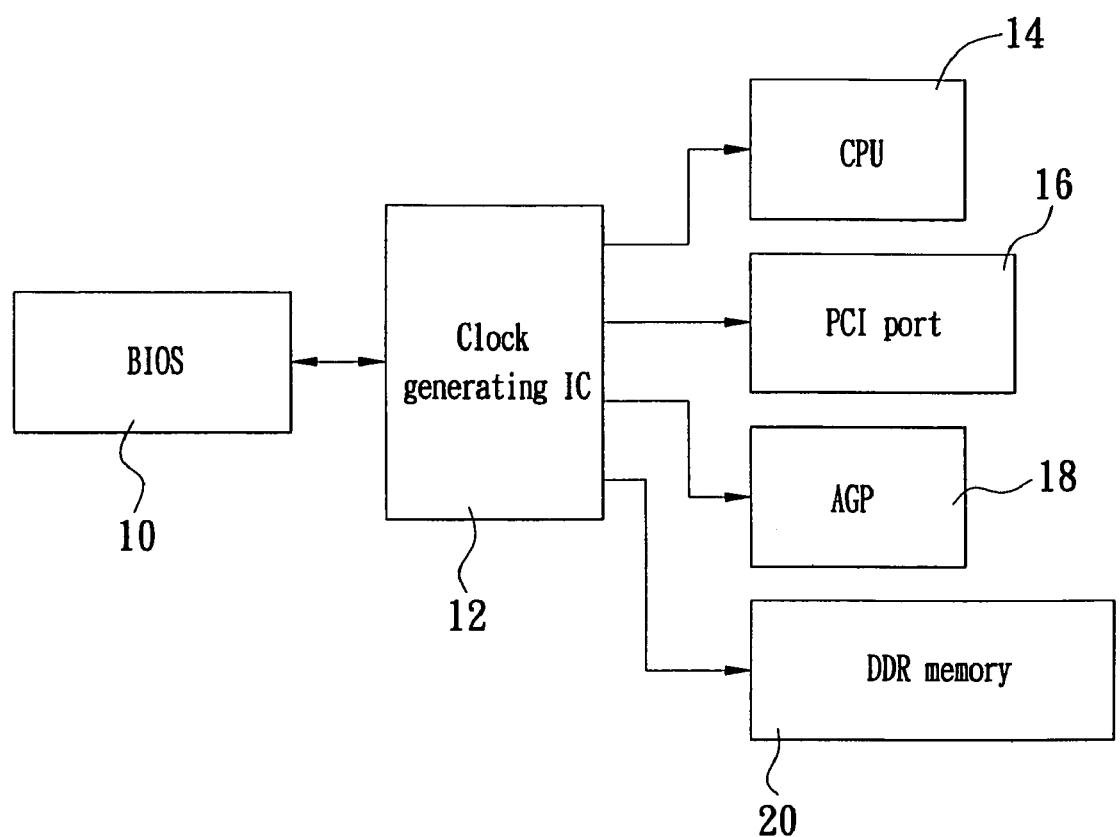
FIG. 1 is a block diagram of a conventional device capable of detecting a BIOS status for clock setting.
Figure 2:
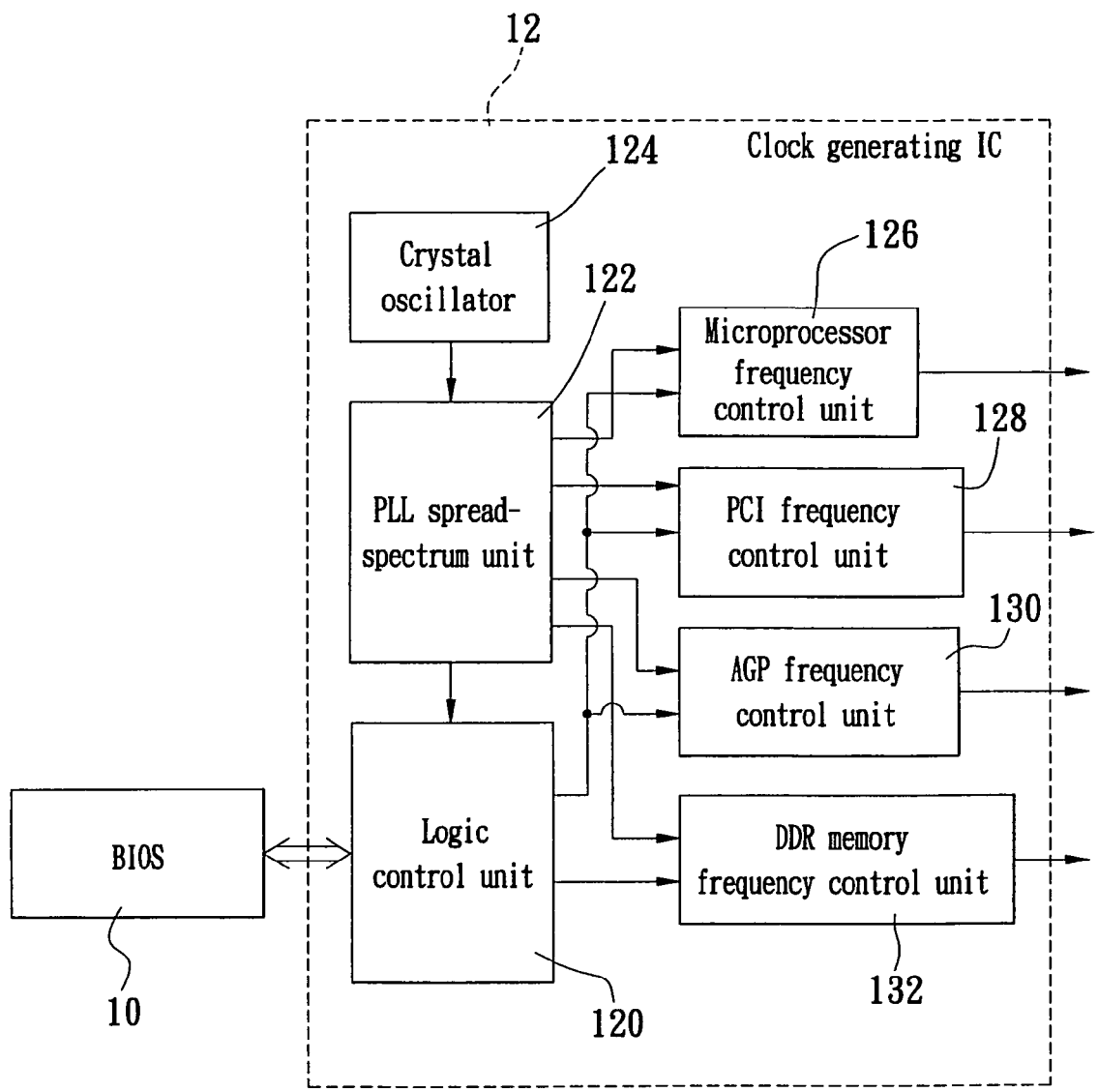
FIG. 2 is a block diagram of a conventional clock generating IC.
Figure 3:
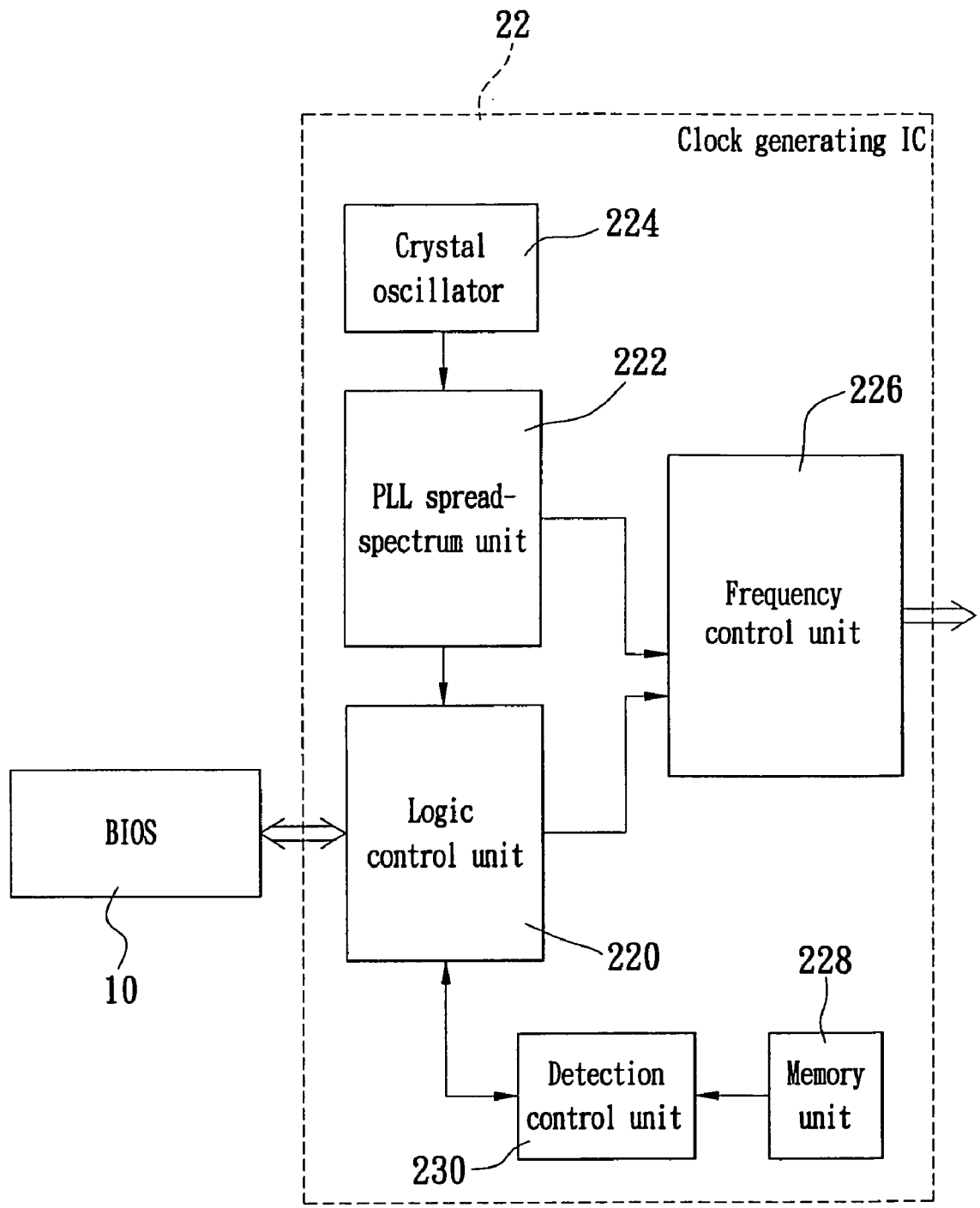
FIG. 3 is an internal block diagram of a clock generating IC in accordance with the present invention.

Reference is made to FIG. 3, which is an internal block diagram of a clock generating IC in accordance with the present invention. It includes a BIOS 10 and a clock generating IC 22. The clock generating IC 22 further includes a logic control unit 220, a PLL spread-spectrum unit 222, a crystal oscillator 224, a frequency control unit 226, a memory unit 228 and a detection control unit 230.

The PLL spread-spectrum unit 222 is electrically connected with the crystal oscillator 224, frequency control unit 226 and logic control unit 220. The detection control unit 230 is electrically connected with the memory unit 228 and logic control unit 220. The logic control unit 220 is electrically connected with the BIOS 10.

The memory unit 228 can be an electrically erasable programmable read-only memory (EEROM), an erasable programmable read-only memory (EROM) or a flash memory. The detection control unit 230 can detect the signal status and the trigger signal status of the BIOS 10. The clock setting value stored in the memory unit 228 can be a fixed value, a value set by the BIOS 10 or a operating clock value of the logic control unit 220 stored in the memory unit 228 by the detection control unit 230 when it detects that the BIOS 10 is working regularly.

Figure 4:
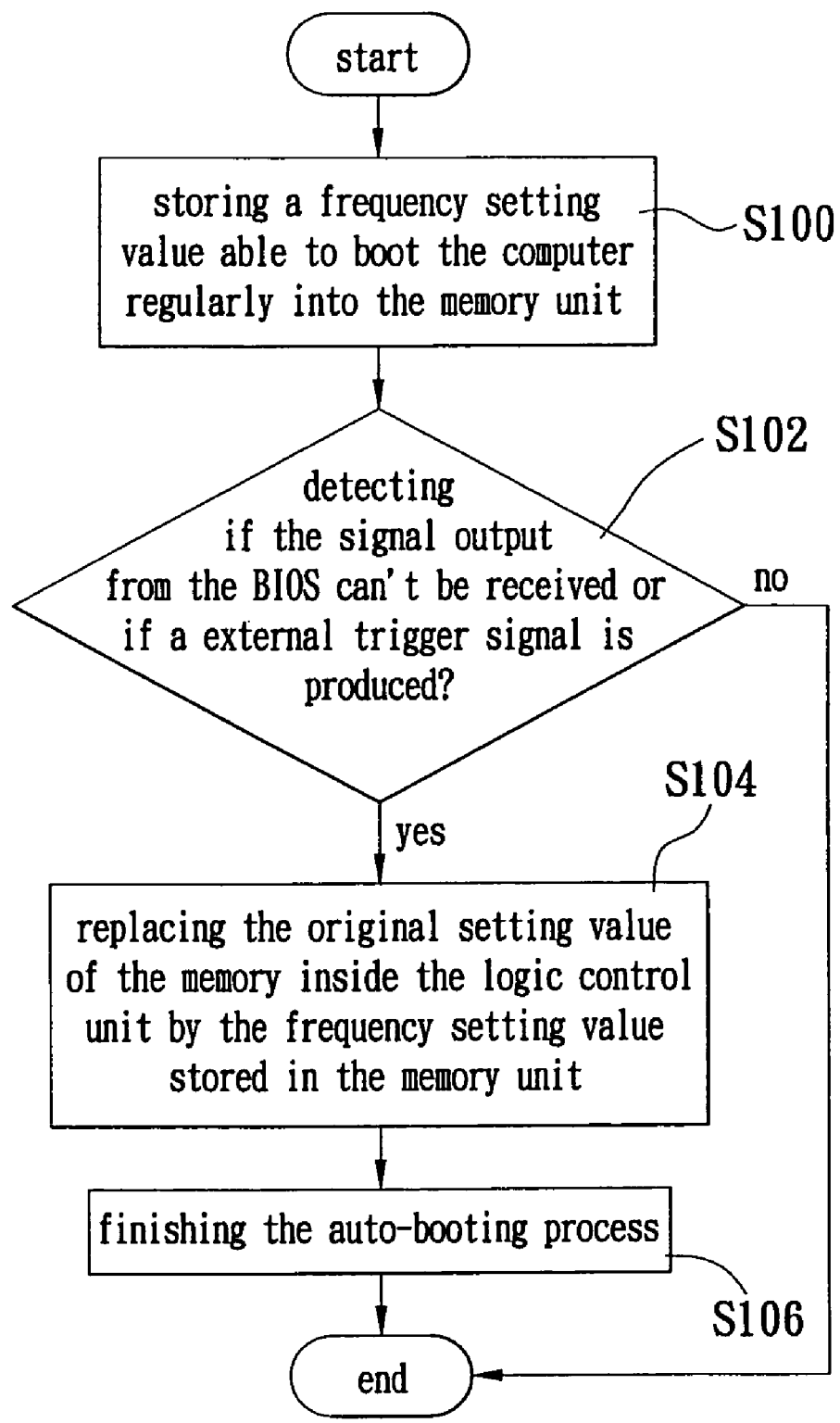
FIG. 4 is a flowchart of a method for clock setting in accordance with the present invention.

Reference is made to FIG. 4, which is a flowchart of a method for clock setting in accordance with the present invention. It includes: storing a frequency setting value able to boot the computer regularly into the memory unit (S100); detecting if the signal output from the BIOS can't be received or if a external trigger signal is produced (S102); if positive, replacing the original setting value of the memory inside the logic control unit by the frequency setting value stored in the memory unit (S104) and then finishing the auto-booting process (S106); otherwise, ending the whole process directly.

The external trigger signal is a high-voltage trigger signal or a low-voltage trigger signal. The high or low-voltage trigger signal is provided by an external circuit, which can be a reset switch or a power switch.

Figure 5:
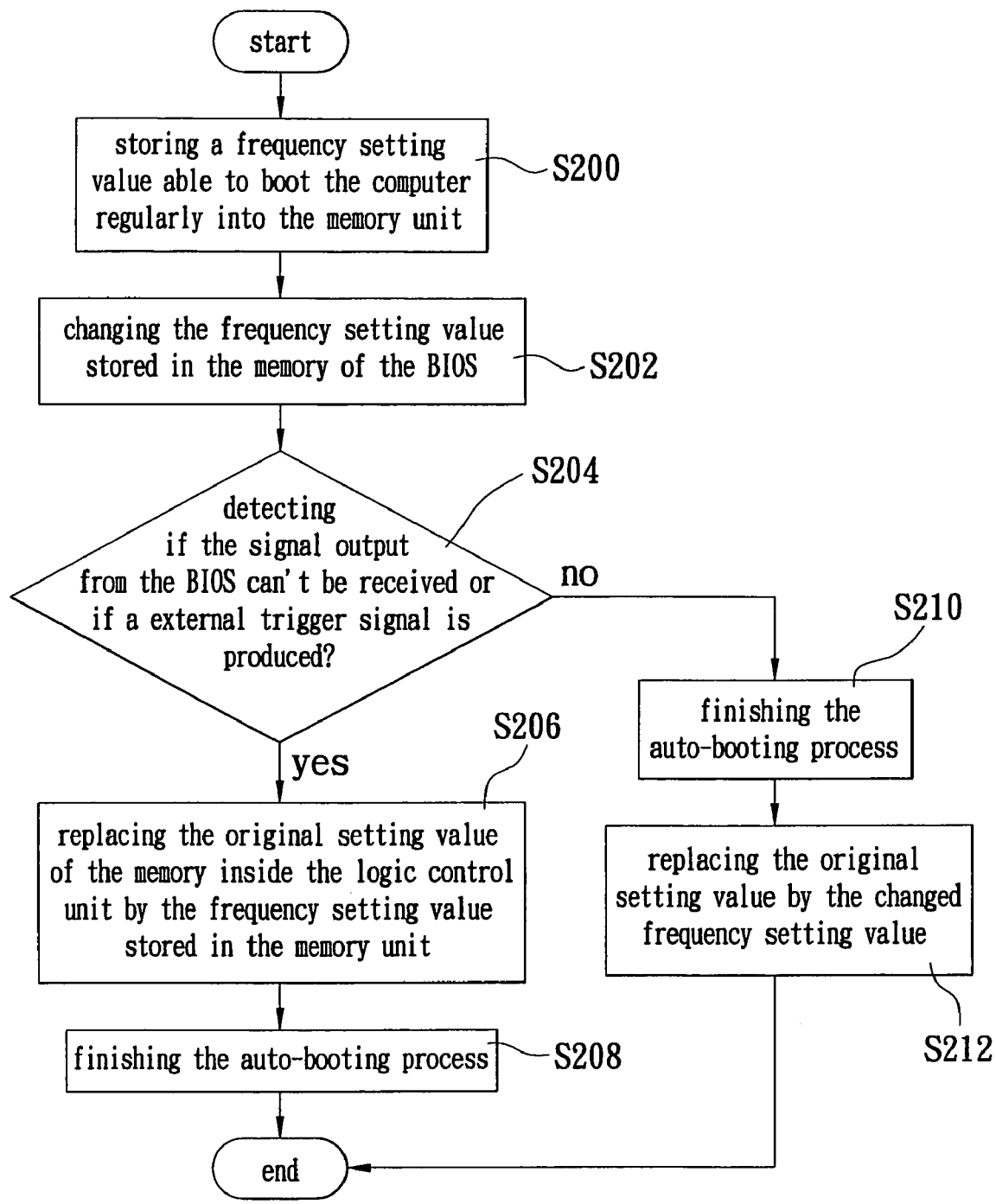
FIG. 5 is a flowchart of a preferred embodiment of the method for clock setting in accordance with the present invention.

Reference is made to FIG. 5, which is a flowchart of a preferred embodiment of the method for clock setting in accordance with the present invention. It includes: storing a frequency setting value able to boot the computer regularly into the memory unit (S200); changing the frequency setting value stored in the memory of the BIOS (S202); detecting if the signal output from the BIOS can't be received or if a external trigger signal is produced (S204); if positive, replacing the original setting value of the memory inside the logic control unit by the frequency setting value stored in the memory unit (S206) and then finishing the auto-booting process (S208); otherwise, directly finishing the auto-booting process (S210) and then replacing the original setting value by the changed frequency setting value (S212).

As described above, the present invention has the following advantages:

(1) In any situation of the system, the present invention can suitably program the clock generating device according to the requirements of the system.

(2) The present invention can reduce booting time.

(3) The number of BIOS codes can be reduced.

(4) The size of the memory unit for storing BIOS codes can be reduced.

(5) The burden of the software engineers can be reduced.

(6) The motherboard can be simplified.

(7) The verifying time can be relatively shortened.

(8) The present invention can protect the motherboard from being counterfeited.

Summing up, the auxiliary device and method capable of detecting the BIOS status for clock setting complied with the present invention is practical, useful, novel and non-obvious. Hence, the present invention fully fits the submission requirements of the patent law.

Although the present invention has been described with reference to the preferred embodiment thereof, it will be understood that the invention is not limited to the details thereof. Various substitutions and modifications have been suggested in the foregoing description, and other will occur to those of ordinary skill in the art. Therefore, all such substitutions and modifications are embraced within the scope of the invention as defined in the appended claims.

What is claimed is:

1. A device for setting a clock, which is a clock generating device of a computer motherboard, comprising:
    a crystal oscillator;
    a frequency control unit;
    a phase-lock-loop (PLL) spread-spectrum unit electrically connected with the crystal oscillator and the frequency control unit;
    a memory unit having a clock setting value stored therein;
    a detection control unit electrically connected with the memory unit and used to detect a signal status; and
    a logic control unit electrically connected with the PLL spread-spectrum unit, the frequency control unit and the detection control unit,
    wherein the clock setting value stored in the memory unit is an operating clock value of the logic control unit stored in the memory unit by the detection control unit when the detection control unit detects a BIOS as working regularly.

2. The device as claimed in the claim 1, wherein the memory unit is an electrically erasable programmable read-only memory (EEROM), an erasable programmable read-only memory (EROM) or a flash memory.

3. The device as claimed in the claim 1, wherein the signal status detected by the detection control unit is an output signal status of a BIOS.

4. The device as claimed in the claim 1, wherein the signal status detected by the detection control unit is a trigger signal status.

5. The device as claimed in the claim 1, wherein the clock setting value stored in the memory unit is set by a BIOS.

6. The device as claimed in the claim 1, wherein the clock setting value stored in the memory unit is a fixed value.

* * * * *